US010276759B2

(12) United States Patent
He

(10) Patent No.: US 10,276,759 B2
(45) Date of Patent: Apr. 30, 2019

(54) PROCESS METHOD USING DEFORMABLE ORGANIC SILICONE RESIN PHOTOCONVERTER TO BOND-PACKAGE LED

(71) Applicant: Jiangsu Cherrity Optronics Co., Ltd., Jiangning Nanjing (CN)

(72) Inventor: Jinhua He, Jiangning Nanjing (CN)

(73) Assignee: Jiangsu Cherrity Optronics Co., Ltd. (CN)

( * ) Notice: Subject to any disclaimer, the term of this patent is extended or adjusted under 35 U.S.C. 154(b) by 0 days.

(21) Appl. No.: 15/751,424

(22) PCT Filed: Dec. 16, 2015

(86) PCT No.: PCT/CN2015/097630
§ 371 (c)(1),
(2) Date: Feb. 8, 2018

(87) PCT Pub. No.: WO2017/028419
PCT Pub. Date: Feb. 23, 2017

(65) Prior Publication Data
US 2018/0233639 A1 Aug. 16, 2018

(30) Foreign Application Priority Data
Aug. 18, 2015 (CN) .......................... 2015 1 0508162

(51) Int. Cl.
*H01L 33/54* (2010.01)
*H01L 33/48* (2010.01)
(Continued)

(52) U.S. Cl.
CPC .............. *H01L 33/54* (2013.01); *B29C 59/04* (2013.01); *H01L 25/075* (2013.01); *H01L 33/26* (2013.01);
(Continued)

(58) Field of Classification Search
CPC ......... H01L 33/48; H01L 33/44; H01L 33/52; H01L 33/50; H01L 2933/0041; B29C 59/04
See application file for complete search history.

(56) References Cited

U.S. PATENT DOCUMENTS

2006/0011288 A1 1/2006 Watanabe et al.
2013/0015472 A1* 1/2013 Lo ....................... H01L 25/0753
257/88
(Continued)

FOREIGN PATENT DOCUMENTS

CN 101872828 A 10/2010
CN 102388090 A 3/2012
(Continued)

*Primary Examiner* — Ahmed N Sefer
(74) *Attorney, Agent, or Firm* — Edwin S. Flores; Chalker Flores, LLP

(57) ABSTRACT

A process method for bond-packaging an LED using a special-shaped organic silicone resin photoconverter includes the following continuous process flow: roll-molding of a refined photoconversion sheet, roll-shaping of a photoconversion sheet array, sheet melting for the photoconversion sheet array, preparation of a flip chip LED array sheet, forming of LED package elements by roll-bonding, curing of the LED package elements, and cutting of the LED package elements. The present invention has a significant advantage of bond-packaging an LED by continuous rolling, and can meet a condition requirement of bond-packaging an LED using a special-shaped organic silicone resin photoconverter, thereby enhancing the production efficiency and yield of LED packages in industrialized batch production.

20 Claims, 12 Drawing Sheets

(51) Int. Cl.
  *H01L 25/075* (2006.01)
  *B29C 59/04* (2006.01)
  *H01L 33/50* (2010.01)
  *H01L 33/52* (2010.01)
  *H01L 33/26* (2010.01)
  *H01L 33/56* (2010.01)
(52) U.S. Cl.
  CPC ............... *H01L 33/48* (2013.01); *H01L 33/50* (2013.01); *H01L 33/52* (2013.01); *H01L 33/56* (2013.01); *H01L 2933/0033* (2013.01)

(56) References Cited

U.S. PATENT DOCUMENTS

2014/0001949 A1* 1/2014 Kimura ................. H05B 33/10
  313/498
2018/0198032 A1* 7/2018 He ......................... H01L 33/48

FOREIGN PATENT DOCUMENTS

| CN | 102881780 A | 1/2013 |
| CN | 103531691 A | 1/2014 |
| CN | 104170101 A | 11/2014 |
| CN | 104321888 A | 1/2015 |
| WO | 2017028419 A1 | 2/2017 |

* cited by examiner

PROCESS METHOD USING DEFORMABLE ORGANIC SILICONE RESIN PHOTOCONVERTER TO BOND-PACKAGE LED

CROSS-REFERENCE TO RELATED APPLICATIONS

This application is the National Stage of International Application No. PCT/CN2015/097630, filed on Dec. 16, 2015 claiming the priority of CN 201510508162.0, filed on Aug. 18, 2015, the content of each of which is incorporated by reference herein.

BACKGROUND OF THE INVENTION

Field of the Invention

The present invention relates to the technical field of LED packaging using a photoconverter, and in particular, to a process for bond-packaging an LED using a special-shaped organic silicone resin photoconverter.

Description of Related Art

With the advantages such as high brightness, low heat, long service life, and being environmentally friendly and renewable, LEDs are known as the most promising new generation of green light sources in the $21^{st}$ century. At present, the theoretical service life of the LED can be over 100,000 hours. However, during actual application, limited by many factors such as chip failure, package failure, thermal overstress failure, electrical overstress failure, and/or assembly failure, especially limited by the package failure, the LED prematurely encounters luminous decay or loss of luminous efficacy, thus hindering development of the LED to be a novel energy-saving light source. To solve these problems, many scholars in the field have carried out related researches, and have proposed some improvement measures to enhance luminous efficacy and actual service life of the LED. For example, flip-chip LED packaging is developed in recent years. Compared with conventional LED upright packaging, this flip-chip manner has such advantages as high luminous efficacy, high reliability, and easy integration. This manner also greatly saves packaging materials. For example, materials such as a gold wire, die bonding glue, and a support that are used in the conventional LED upright packaging are no longer needed. Further, this manner greatly simplifies a packaging process. For example, die bonding, wire soldering, and even light splitting in the conventional LED upright packaging are no longer needed. In this way, the LED flip-chip packaging is increasingly widely applied. However, it should also be noted that, the existing flip-chip LED packaging technologies mostly bond a photoconverter made of an organic silicone resin to a flip chip LED by using a casting process, a screen printing process, an upper and lower flat plate molding process, a single roller pressing process, and the like. These processes and matched packaging equipment cannot desirably solve flaws such as pores and unequal thickness of the photoconverter made of the organic silicone resin, thus causing a low yield of the LEDs packaged by using a photoconverter. In addition, due to low production efficiency, the high product costs cannot be reduced.

Chinese patent application NO. 201010204860.9 discloses a "flip-chip LED packaging method", which includes steps of: (a) coating a surface of an LED chip with a photoconverter through screen printing, and baking the photoconverter to cure the photoconverter; (b) fixing the LED chip on a chip substrate, such that electrodes of the LED chip and electrodes of the chip substrate are bonded; (c) fixing the LED chip and the chip substrate to the bottom of a reflector cup on a support; (d) separately connecting positive and negative electrodes of the fixed chip substrate to positive and negative electrodes of the support by using wires; (e) placing a sealing mold or lens cover on the support on which the LED chip and the chip substrate are fixed, and filling the sealing mold or lens cover with silica gel; and (f) baking a whole structure to cure it. This method uses the screen printing process to enhance uniformity of coating thickness of the photoconverter and enhance distribution uniformity of fluorescent powder particles, so as to improve the yield. However, there exist the following obvious defects: First, after the surface of the LED chip is coated with the photoconverter made of the organic silicone resin through a screen printing process, due to thermal overstress in a subsequent baking and curing procedure, pores still occur in part of the photoconverter coating and the coated surface of the LED chip, thus forming sags and crests. Secondly, after the sealing mode or lens cover is filled with the silica gel and packaged together with the photoconverter-coated LED chip, due to thermal overstress in the subsequent procedure of baking and curing the whole structure, pores still occur in part of the silica gel layer on the sealing mold or lens cover, thus forming sags and crests. Because the thermal overstress impact on the LED chip cannot be resolved in the packaging procedure, LED luminous efficacy is reduced inevitably. Thirdly, no intelligent control system is equipped to control the whole LED chip packaging process, which directly affects improvement of the yield.

Chinese patent application NO. 201310270747.4 discloses an "LED coated with photoconverter layer, manufacturing method for same, and LED device". This solution includes: an LED configuration stage, in which an LED is configured on a surface of a support chip in a through-thickness direction; a layer configuration stage, in which a photoconverter layer is configured on a surface of the support chip in the through-thickness direction in the same manner as LED configuration, the photoconverter layer being formed by active energy ray cured resin which is cured by irradiation with an active energy ray and a fluorescent resin composition of the photoconverter; a curing stage, in which the photoconverter layer is irradiated with an active energy ray to cure the photoconverter layer; a cutting stage, in which the photoconverter layer is cut corresponding to the LED, to obtain an LED coated with the photoconverter layer; and an LED separation stage, in which the LED coated with the photoconverter layer is separated from the support chip after the cutting process. This method aims to offer a solution to uniform configuration of photoconverters around the LED to avoid damage, thus obtaining an LED coated with a photoconverter layer, and an LED device having the LED coated with the photoconverter layer. However, there exist the following obvious defects: First, in a curing procedure of the fluorescent resin composition of the photoconverter, due to thermal overstress, pores still occur in part of the photoconverter surface layer, thus forming sags and crests. Secondly, the LED coated with the photoconverter layer is still affected by the thermal overstress, causing a decrease in luminous efficacy of the LED in use. Thirdly, the stages of the whole packaging process are complicated, causing low production efficiency of LED packages. Fourthly, an upper and lower flat plate molding process may cause displacement of a flip chip, thus inevitably reducing the yield.

Chinese patent application NO. 201380027218.X discloses a "resin sheet laminate, and manufacturing method for semiconductor light-emitting elements using same". In this solution, the resin sheet laminate is formed by disposing a fluorophor-containing resin layer on a substrate, where the fluorophor-containing resin layer has multiple regions, the substrate has a lengthwise direction and a transverse direction, and the multiple regions are arranged along the lengthwise direction repeatedly to form columns. By using the resin sheet laminate, this solution aims to enhance uniformity of color and brightness of semiconductor light-emitting elements to which the fluorophor-containing resin layer is attached, and make it easy to manufacture and free to design the elements. However, there exist the following obvious defects: First, the used fluorescent resin sheet is a cured fluorescent resin sheet, and therefore, possible residual pores, sags and crests, or other flaws produced during processing cannot be effectively eliminated. Secondly, in a bonding stage, a pressure is exerted by a pressurizing tool from a side of the semiconductor light-emitting elements, which may damage the semiconductor light-emitting elements. Thirdly, in the bonding stage using an adhesive in the fluorophor-containing resin layer, it is difficult to eliminate residuals from the semiconductor light-emitting elements after bonding, and pores easily occur in the bonding procedure, thus reducing the yield; in addition, existence of the bonding layer reduces light emission efficiency of the LED elements. Fourthly, the substrate under the fluorescent resin sheet bonded to the light emitting surface of the semiconductor light-emitting elements are not removed, which directly affects luminous efficacy of the semiconductor light-emitting elements. Fifthly, the multiple regions of the fluorophor-containing resin layer are arranged in the lengthwise direction repeatedly to form columns, but actually it is complex to arrange the multiple regions of the fluorophor-containing resin layer in such a manner, thus affecting the packaging efficiency of the whole elements. An error in arrangement positions of the multiple regions directly affects the precision of subsequent bonding with the light-emitting elements. If the multiple regions cannot be rendered uniform in size and thickness, a severe problem of product inconsistency may emerge.

To sum up, nowadays, how to overcome the defects in the prior art has become one of major difficulties to be solved urgently in the technical field of LED packaging using a photoconverter.

SUMMARY OF THE INVENTION

An objective of the present invention is to overcome the defects in the prior art and provide a process for bond-packaging an LED using a special-shaped organic silicone resin photoconverter. The present invention has a significant advantage of bond-packaging the LED by continuous rolling, can meet a condition requirement of bond-packaging an LED using a special-shaped organic silicone resin photoconverter, and enhance the production efficiency and yield of LED packages in industrialized batch production.

A process for bond-packaging an LED using a special-shaped organic silicone resin photoconverter provided by the present invention includes the following continuous process flow: roll-molding of a refined photoconversion sheet, roll-shaping of a photoconversion sheet array, sheet melting for the photoconversion sheet array, preparation of a flip chip LED array sheet, forming of LED package elements by roll-bonding, curing of the LED package elements, and cutting of the LED package elements, including the following basic steps:

step 1: roll-molding of a refined photoconversion sheet: in a vacuum heating condition, rolling a first outer protective film, a semi-cured photoconversion material, and a second outer protective film by using one or more sets of smooth-surface roll-laminating apparatuses, to obtain a refined photoconversion sheet formed by the first outer protective film, a semi-cured photoconversion sheet, and the second outer protective film, the semi-cured photoconversion material being a semi-cured photoconversion membrane or semi-cured photoconversion slurry, and a material of the second outer protective film being meltable organic silicon photosensitive resin containing a photoconversion material;

step 2: roll-shaping of a photoconversion sheet array: in a vacuum condition, performing heating and roll-shaping on the refined photoconversion sheet with the outer protective films by using a first rolling device with a protrusion array and a second rolling device with a recess array that are disposed face-to-face and aligned with each other, to obtain a photoconversion sheet array formed by individual photoconversion sheets with recesses, the recesses being located at a side close to the second outer protective film;

step 3: sheet melting for the photoconversion sheet array: in a vacuum illumination condition, melting the second outer protective film of the photoconversion sheet array in step 2, to obtain a sheet-melted photoconversion sheet array;

step 4: preparation of a flip chip LED array sheet: acquiring a flip chip LED array sheet, where flip chip LEDs in the flip chip LED array sheet are arranged in an array on a carrier film, the flip chip LED referring to an individual LED flip chip or a flip chip LED assembly, and the flip chip LED assembly being composed of two or more individual flip chip LEDs;

step 5: forming of LED package elements by roll-bonding: in a vacuum heating condition, performing roll-bonding on the sheet-melted photoconversion sheet array in step 3 and the flip chip LED array sheet in step 4 by using a third rolling device with a smooth surface and a fourth rolling device with a recess array, the photoconversion sheet array and the flip chip LED array sheet facing each other and being aligned with each other, such that the flip chip LEDs in the flip chip LED array sheet are bonded to and embedded in the recesses on the individual photoconversion sheets of the sheet-melted photoconversion sheet array, to obtain LED package elements, a recess shape and recess dimensions of the recess array of the fourth rolling device being the same as those of the recess array of the second rolling device;

step 6: curing of the LED package elements: by means of heat curing and/or photocuring, curing the LED package elements in step 5 by using a curing apparatus, to obtain a cured LED package elements; and step 7: cutting of the LED package elements: removing the first outer protective film from the cured LED package elements in step 6, and cutting the cured LED package elements, to form finished LED package elements having slits for splitting the finished product into individual LED package elements.

An implementation principle of the present invention is as follows: To better solve the major problems in the existing LED packaging process, the present invention subtly designs a novel process for bond-packaging an LED using a special-shaped organic silicone resin photoconverter. A principle of bond-packaging by rolling of the present invention is as follows: First, a roller is used to roll a semi-cured photoconversion sheet to produce a flow in sags and crests in the sheet, so as to eliminate possible residual pores, sags and crests, or other flaws produced during processing in the semi-cured photoconversion sheet, thereby obtaining a flat refined photoconversion sheet without pores and having a uniform thickness. Secondly, the rolled semi-cured photoconversion sheet is deformable during processing, to form a photoconverter light emitting surface layer with a required optimal shape, such as a cambered surface, a hemispheric surface or a planar surface. Thirdly, the material of the second outer protective film is meltable organic silicon photosensitive resin containing a photoconversion material, and therefore the second outer protective film and the semi-cured photoconversion sheet can be effectively fused and integrated by means of illumination, thus achieving tight bonding to flip chip LEDs. Fourthly, the present invention provides a continuous process flow, which can meet processing conditions of batch production of LED package elements and achieve completely consistent specifications and dimensions. In this way, the production efficiency of the LED package elements is enhanced, brightness and color uniformity of finished LED package elements is improved, and the yield is greatly improved.

The present invention has the following remarkable advantages in comparison with the prior art:

First, the present invention provides a novel process flow of LED bond-packaging by continuous rolling, which solves the problems of low light emission efficiency, low production efficiency, and a low yield of the LED bond-packaged by using existing conventional processes such as a casting process, a screen printing process, an upper and lower flat plate molding process, a single roller pressing process, and the like. The present invention can meet a condition requirement of bond-packaging the LED by using a semi-cured organic silicone resin photoconverter, and enhance the production efficiency and yield of industrialized LED packaging in batches.

Secondly, the present invention provides a new process of forming a special-shaped photoconversion sheet, and therefore a light-emitting surface layer of various special shapes such as an arc, a hemisphere, and a rectangle can be manufactured. In this way, possible residual pores, sags and crests, or other flaws produced during processing in the photoconversion sheet can be effectively eliminated, thus significantly improving brightness and color uniformity of finished LED package elements. Moreover, the special-shaped light-emitting surface layer can effectively enhance the light emission efficiency and uniformity of the finished LED package elements.

Thirdly, the new process of sheet melting provided by the present invention can overcome the defects in the existing film removing process for a protective film layer, and implement a continuous process flow of roll-bonding an organic silicone resin photoconverter sheet to an LED. Moreover, it is suitable to equip an equipment system for implementing a continuous process and to carry out intelligent control, so as to better meet a production requirement of industrialized LED packaging in batches. In this way, the production efficiency of industrialized LED packaging in batches is remarkably improved.

Fourthly, the process provided by the present invention is widely applicable to a packaging process of bonding an organic silicone resin photoconverter to flip chip LEDs of different power, thus completely meeting a requirement of refining the product production process during industrialized LED packaging in batches.

BRIEF DESCRIPTION OF THE DRAWINGS

FIG. 8A-1 is a left view, FIG. 8A-2 is a right view, FIG. 8A-3 is a bottom view, and FIG. 8A-4 is a three-dimensional view;

FIG. 8B-1 is a left view, FIG. 8B-2 is a right view, FIG. 8B-3 is a bottom view, and FIG. 8B-4 is a three-dimensional view; FIG. 8C-1 is a left view, FIG. 8C-2 is a right view, FIG. 8C-3 is a bottom view, and FIG. 8C-4 is a three-dimensional view.

Meaning of numerals in the accompanying drawings of the present invention:

1-1 Smooth-surface single-wheeled roller A1 of a smooth-surface double-roller roll-laminating apparatus in a roll-molding step
1-2 Smooth-surface single-wheeled roller B1 of a smooth-surface double-roller roll-laminating apparatus in a roll-molding step
1-3 Smooth-surface single-wheeled roller A2 of a smooth-surface double-roller roll-laminating apparatus in a roll-molding step
1-4 Smooth-surface single-wheeled roller B2 of a smooth-surface double-roller roll-laminating apparatus in a roll-molding step
1-5 First buffer roller in a roll-molding step
1-6 Second buffer roller in a roll-molding step
2-1 First single-wheeled roller with a protrusion array in a roll-shaping step
2-2 Second single-wheeled roller with a recess array in a roll-shaping step
2-3 Second planar conveyor with a recess array in a roll-shaping step
2-4 Protrusion on a first single-wheeled roller with a protrusion array in a roll-shaping step
2-5 Recess on a second single-wheeled roller with a recess array in a roll-shaping step
2-6 Recess on a second planar conveyor with a recess array in a roll-shaping step
3 Sheet-melting apparatus
4-1 Third single-wheeled roller with a smooth surface in a roll-bonding step
4-2 Fourth single-wheeled roller with a recess array in a roll-bonding step
4-3 Recess on a fourth single-wheeled roller with a recess array in a roll-bonding step
4-4 LED flip chip in a flip chip LED array sheet
4-5 Carrier film in a flip chip LED array sheet
5 Curing apparatus
6 Removing and cutting apparatus
7 Wind-up roller
8-1 Semi-cured photoconversion membrane
8-2 Semi-cured photoconversion slurry
8-3 First outer protective film
8-4 Second outer protective film
8-5 Semi-cured photoconversion sheet
8-6 Refined photoconversion sheet
8-7 Individual photoconversion sheet in a photoconversion sheet array formed by individual photoconversion sheets with recesses before sheet melting
8-8 Photoconversion sheet in a photoconversion sheet array formed by individual photoconversion sheets with recesses after sheet melting
8-9 LED package elements formed after roll-bonding
9-1 Third buffer roller
9-2 LED flip chip buffer roller

DETAILED DESCRIPTION OF THE INVENTION

Specific implementations of the present invention are described in detail below with reference to the accompanying drawings and embodiments.

Embodiment 1

Figure 1:
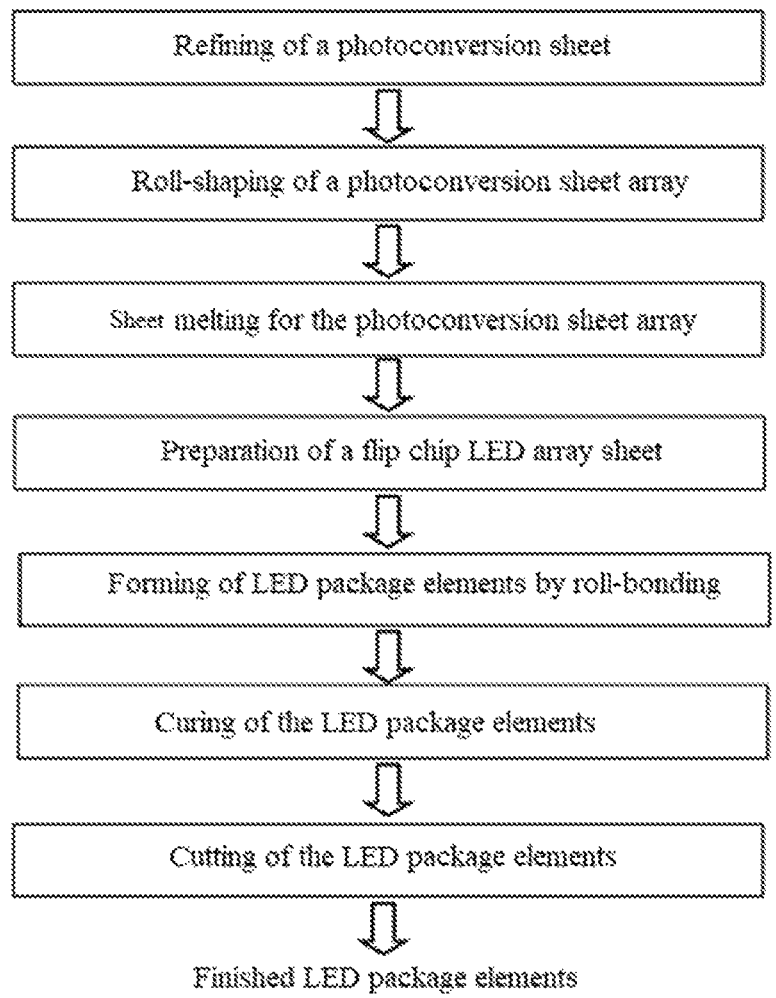
FIG. 1 is a schematic block diagram of procedures of a process for bond-packaging an LED using a special-shaped organic silicone resin photoconverter according to the present invention.
Figure 2:
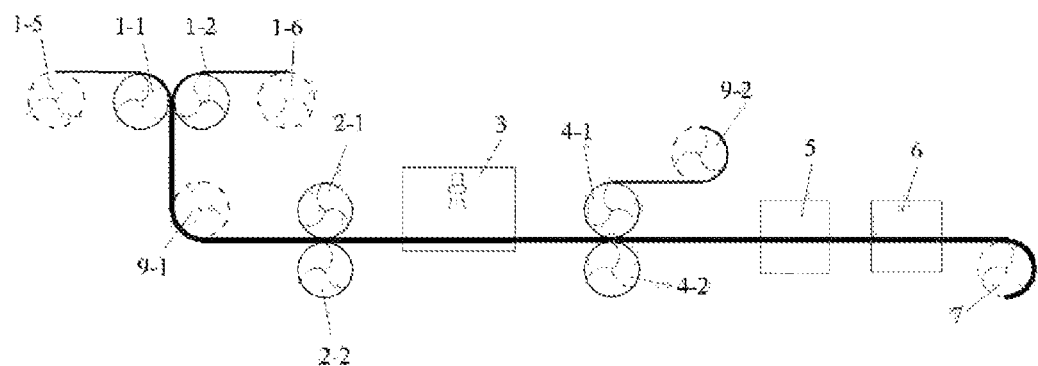
FIG. 2 is a schematic structural diagram of a flow layout of the process for bond-packaging an LED using a special-shaped organic silicone resin photoconverter according to the present invention.

Referring to FIG. 1 and FIG. 2, the present invention provides a process for bond-packaging an LED using a special-shaped organic silicone resin photoconverter, which includes the following continuous process flow: roll-molding of a refined photoconversion sheet, roll-shaping of a photoconversion sheet array, sheet melting for the photoconversion sheet array, preparation of a flip chip LED array sheet, forming of LED package elements by roll-bonding, curing of the LED package elements, and cutting of the LED package elements. The process specifically includes the following steps:

step 1: roll-molding of a refined photoconversion sheet: in a vacuum heating condition, rolling a first outer protective film, a semi-cured photoconversion material, and a second outer protective film by using one or more sets of smooth-surface roll-laminating apparatuses, to obtain a refined photoconversion sheet formed by the first outer protective film, a semi-cured photoconversion sheet, and the second outer protective film, the semi-cured photoconversion material being a semi-cured photoconversion membrane or semi-cured photoconversion slurry, and a material of the second outer protective film being meltable organic silicon photosensitive resin containing a photoconversion material;

step 2: roll-shaping of a photoconversion sheet array: in a vacuum condition, performing heating and roll-shaping on the refined photoconversion sheet with the outer protective films by using a first rolling device with a protrusion array and a second rolling device with a recess array that are disposed face-to-face and aligned with each other, to obtain a photoconversion sheet array formed by individual photoconversion sheets with recesses, the recesses being located at a side close to the second outer protective film;

step 3: sheet melting for the photoconversion sheet array: in a vacuum illumination condition, melting the second outer protective film of the photoconversion sheet array in step 2, to obtain a sheet-melted photoconversion sheet array;

step 4: preparation of a flip chip LED array sheet: acquiring a flip chip LED array sheet, where flip chip LEDs in the flip chip LED array sheet are arranged in an array on a carrier film, the flip chip LED referring to an individual LED flip chip or a flip chip LED assembly, and the flip chip LED assembly being composed of two or more individual flip chip LEDs;

step 5: forming of LED package elements by roll-bonding: in a vacuum heating condition, performing roll-bonding on the sheet-melted photoconversion sheet array in step 3 and the flip chip LED array sheet in step 4 by using a third rolling device with a smooth surface and a fourth rolling device with a recess array, the photoconversion sheet array and the flip chip LED array sheet facing each other and being aligned with each other, such that the flip chip LEDs in the flip chip LED array sheet are bonded to and embedded in the recesses on the individual photoconversion sheets of the sheet-melted photoconversion sheet array, to obtain LED package elements, a recess shape and recess dimensions of the recess array of the fourth rolling device being the same as those of the recess array of the second rolling device;

step 6: curing of the LED package elements: by means of heat curing and/or photocuring, curing the LED package elements in step 5 by using a curing apparatus, to obtain cured LED package elements; and step 7: cutting of the LED package elements: removing the first outer protective film from the cured LED package elements in step 6, and cutting the cured LED package elements, to form finished LED package elements having slits for splitting the finished product into individual LED package elements.

It should be particularly noted that:

The present invention is applicable to production and processing of a photoelectric device or an electronic device of a structure similar to that of a flip chip LED.

Any existing organic silicone resin having high light transmittance and desirable temperature resistance may be selected to be used in the process of the present invention. In order to meet a temperature requirement of reflow soldering of common LED package elements in use and to resist aging caused by heat and light in long-term use, the present invention preferably uses methyl vinyl organic silicone resin. Existing quantum dot fluorophor and fluorescent powder can both be selected to be used in the process of the present invention.

In a general case, mixed slurry used in the present invention does not need to contain an adhesive. When finished LED package elements are used in an extreme condition and adhesion between a photoconverter and an LED needs to be further enhanced, the mixed slurry used in the present invention may contain an adhesive.

Figure 3A:
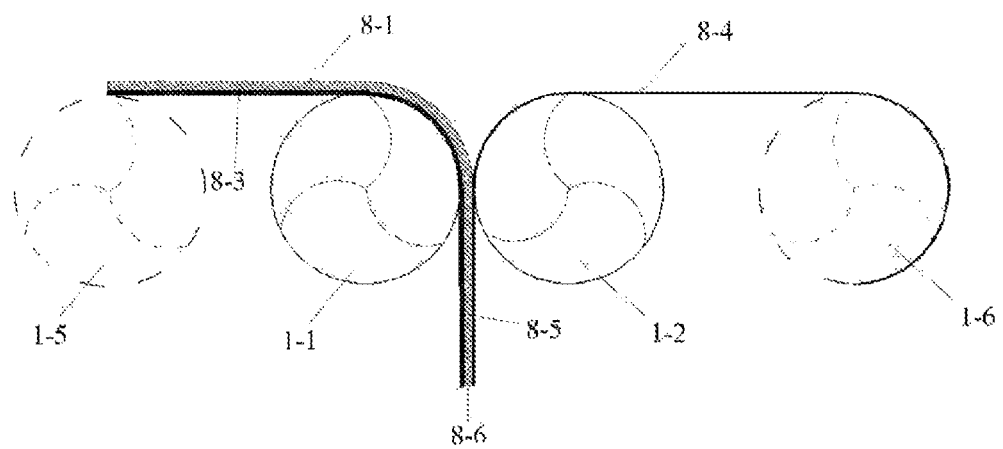
FIG. 3A is a schematic process diagram of a first embodiment of fabricating a refined photoconversion sheet in the process for bond-packaging an LED using a special-shaped organic silicone resin photoconverter according to the present invention.
Figure 3B:
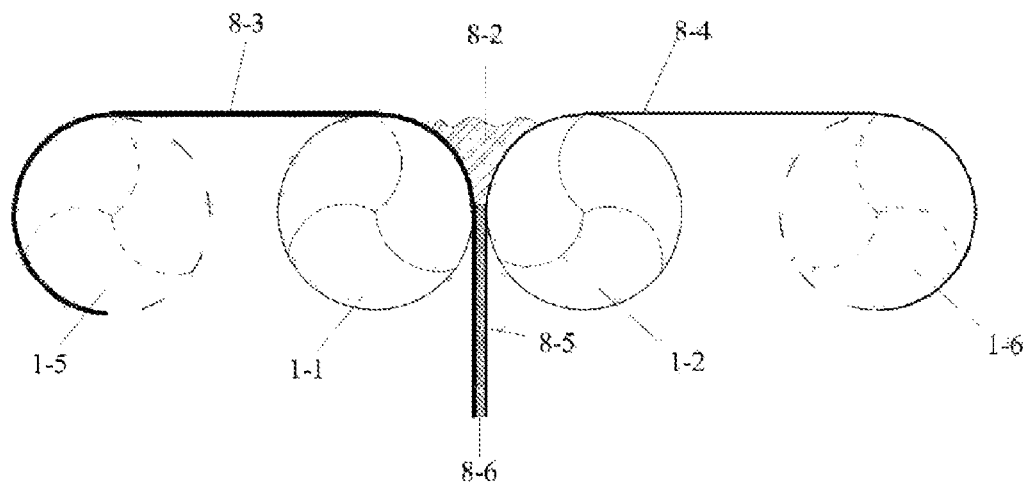
FIG. 3B is a schematic process diagram of a second embodiment of fabricating a refined photoconversion sheet in the process for bond-packaging an LED using a special-shaped organic silicone resin photoconverter according to the present invention.
Figure 3C:
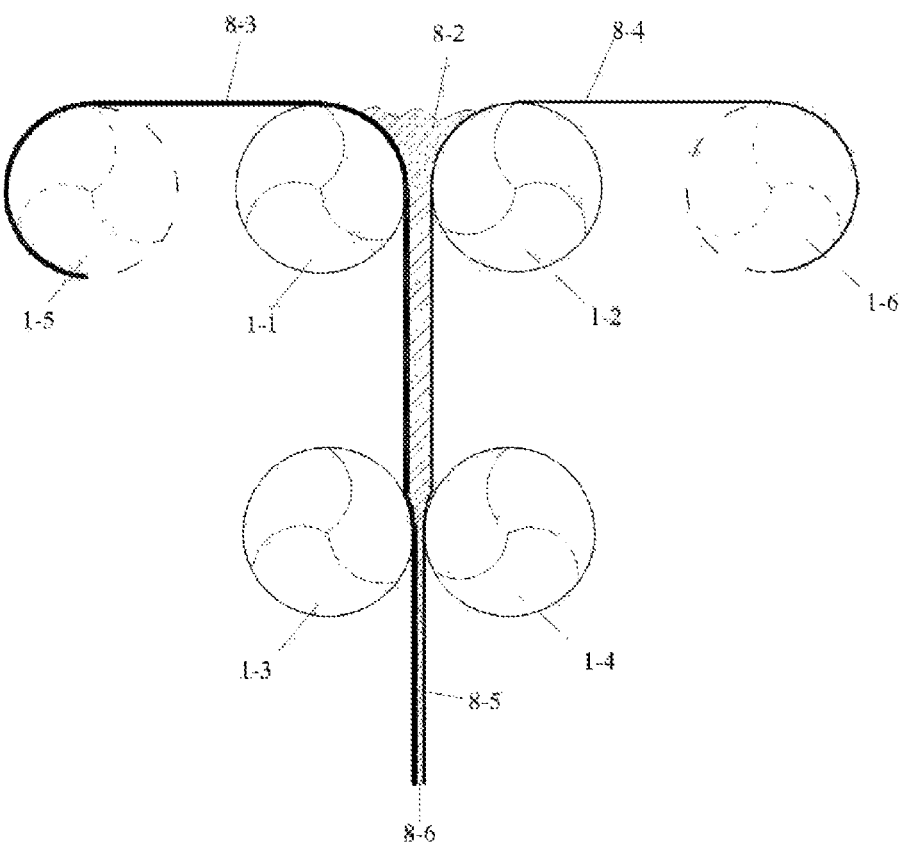
FIG. 3C is a schematic process diagram of a third embodiment of fabricating a refined photoconversion sheet in the process for bond-packaging an LED using a special-shaped organic silicone resin photoconverter according to the present invention.

Further preferred solutions of the process for bond-packaging an LED using a special-shaped organic silicone resin photoconverter according to the present invention are as follows:

The roll-molding of a refined photoconversion sheet in step 1 refers to rolling first outer protective film, a semi-cured photoconversion material, and a second outer protective film by using one or more sets of smooth-surface roll-laminating apparatuses, where rolling is performed sequentially by using one or more sets of smooth-surface double-roller roll-laminating apparatuses that are disposed face-to-face and aligned with each other and/or a rolling apparatus formed by a smooth-surface single-wheeled roller and a smooth-surface planar conveyor, to obtain a refined photoconversion sheet. Referring to FIG. 3A, FIG. 3B and FIG. 3C, FIG. 3A shows step 1 of rolling a first outer protective film (8-3), a semi-cured photoconversion membrane (8-1), and a second outer protective film (8-4) by using one set of smooth-surface roll-laminating apparatuses, to obtain a refined photoconversion sheet (8-6); FIG. 3B shows step 1 of rolling a first outer protective film (8-3), semi-cured photoconversion slurry (8-2), and a second outer protective film (8-4) by using one set of smooth-surface roll-laminating apparatuses, to obtain a refined photoconversion sheet (8-6); FIG. 3C shows step 1 of rolling a first outer protective film (8-3), semi-cured photoconversion slurry (8-2), and a second outer protective film (8-4) by using two sets of smooth-surface roll-laminating apparatuses, to obtain a refined photoconversion sheet (8-6).

The temperature of the roll-molding of a refined photoconversion sheet in step 1 ranges from 50° C. to 120° C. An optimal temperature of the roll-molding ranges from 80° C. to 100° C.

The thickness of the refined photoconversion sheet in step 1 is within 800 μm. An optimal thickness of the refined photoconversion sheet ranges from 150 μm to 250 μm.

A material of the semi-cured photoconversion sheet in step 1 is a semi-cured organic silicone resin fluorescent powder membrane or a semi-cured organic silicone resin quantum dot fluorophor membrane.

A material of the first outer protective film in step 1 is polyester, polyolefin, or polyether.

The photoconversion material in the second outer protective film in step 1 and the photoconversion material in the semi-cured photoconversion sheet are identical materials with identical contents. The material of the second outer protective film further includes an adhesive.

Figure 4A:
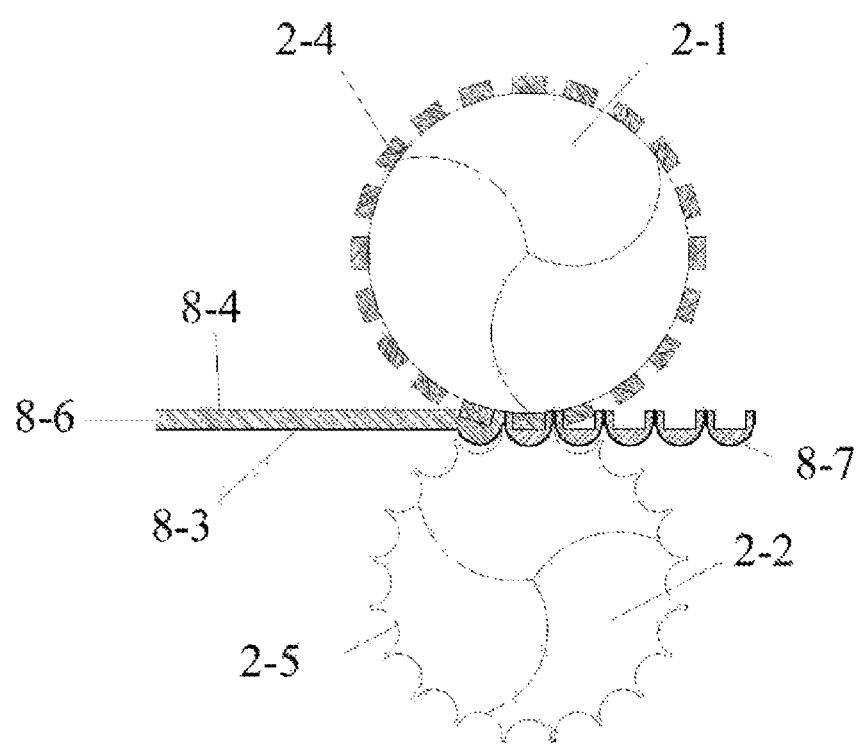
FIG. 4A is a schematic process diagram of a first embodiment of performing roll-shaping on a photoconversion sheet array in the process for bond-packaging an LED using a special-shaped organic silicone resin photoconverter according to the present invention.
Figure 4B:
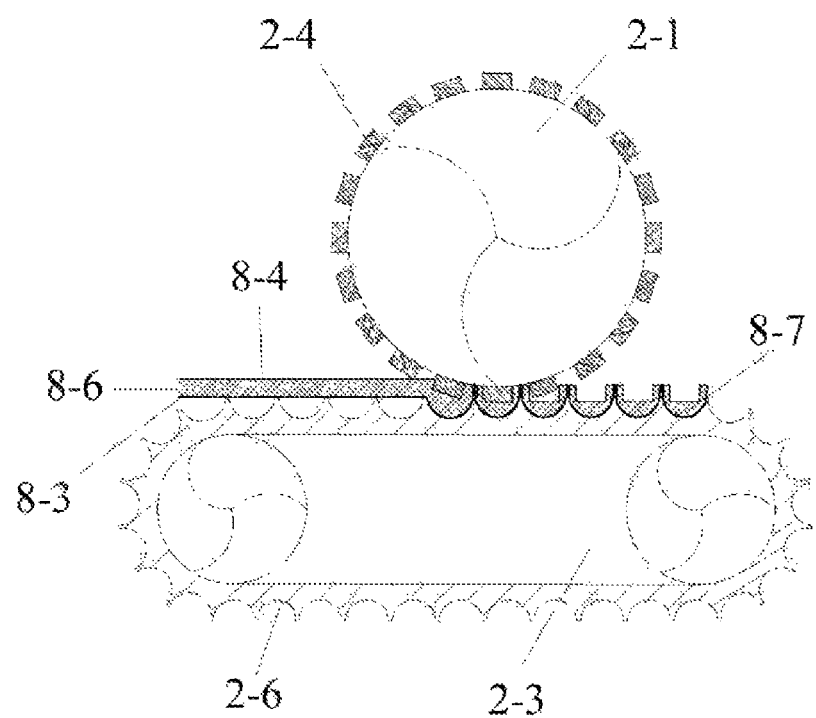
FIG. 4B is a schematic process diagram of a second embodiment of performing roll-shaping on a photoconversion sheet array in the process for bond-packaging an LED using a special-shaped organic silicone resin photoconverter according to the present invention.

In step 2, the first rolling device with a protrusion array is a first single-wheeled roller with a protrusion array or a first planar conveyor with a protrusion array; the second rolling device with a recess array is a second single-wheeled roller with a recess array or a second planar conveyor with a recess array; and at least one of the first rolling device and the second rolling device is a single-wheeled roller. Referring to FIG. 4A and FIG. 4B, FIG. 4A shows step 2 of performing heating and roll-shaping on the refined photoconversion sheet (8-6) with the first outer protective film (8-3) and the second outer protective film (8-4) by using a first single-wheeled roller (2-1) with a protrusion array and a second single-wheeled roller (2-2) with a recess array that are disposed face-to-face and aligned with each other, to obtain a photoconversion sheet array formed by individual photoconversion sheets (8-7) with recesses; and FIG. 4B shows step 2 of performing heating and roll-shaping on the refined photoconversion sheet (8-6) with the first outer protective film (8-3) and the second outer protective film (8-4) by using a first single-wheeled roller 1 (2-1) with a protrusion array and a second planar conveyor (2-3) with a recess array that are disposed face-to-face and aligned with each other, to obtain a photoconversion sheet array formed by individual photoconversion sheets (8-7) with recesses.

The shape of each individual photoconversion sheet with recesses in step 2 is a cambered surface, a hemispheric surface, or a planar surface.

In each individual photoconversion sheet with recesses in step 2, the length, width, and height of a recess are 1.01 to 1.05 times of those of a flip chip LED. Preferably, the length, width, and height of the recess are 1.02 times of those of the flip chip LED.

The temperature of the roll-shaping of a photoconversion sheet array in step 2 ranges from 50° C. to 120° C. An optimal temperature of the roll-shaping ranges from 80° C. to 100° C.

Figure 5:
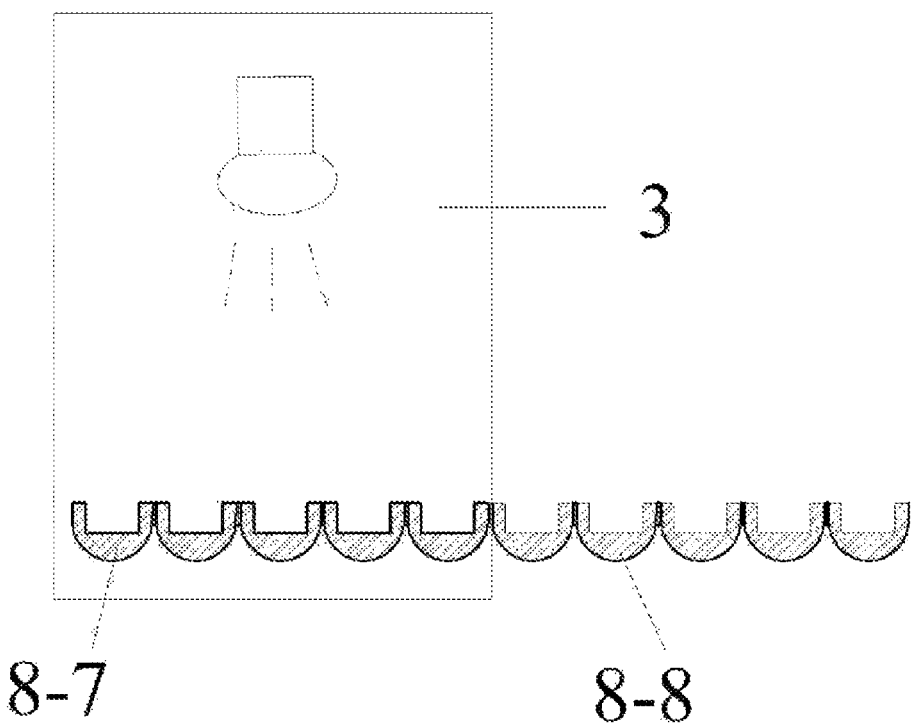
FIG. 5 is a schematic process diagram of sheet melting for the photoconversion sheet array in the process for bond-packaging an LED using a special-shaped organic silicone resin photoconverter according to the present invention.

The sheet melting in step 3 refers to: melting the second outer protective film by means of light irradiation and integrating the melted sheet with the semi-cured photoconversion sheet in step 1. Referring to FIG. 5, FIG. 5 shows that in step 3, before sheet melting, the photoconversion sheet array formed by individual photoconversion sheets (8-7) with recesses passes through a sheet-melting apparatus 3, and the second outer protective film (8-4) of the photoconversion sheet array is illuminated by light and then is integrated with the semi-cured photoconversion sheet, to obtain a sheet-melted photoconversion sheet array formed by individual photoconversion sheets (8-8) with recesses.

The carrier film in the flip chip LED array sheet in step 4 is a stretchable carrier film, and a material of the stretchable carrier film is one of heat-resistant polyester, polydimethylsiloxane, and polyvinyl chloride.

Step 5 of performing roll-bonding on the sheet-melted photoconversion sheet array in step 3 and the flip chip LED array sheet in step 4 by using a third rolling device with a smooth surface and a fourth rolling device with a recess array, the photoconversion sheet array and the flip chip LED array sheet facing each other and being aligned with each other refers to: arranging the photoconversion sheet array on a fourth single-wheeled roller with a recess array or a fourth planar conveyor with a recess array, arranging the flip chip LED array sheet on a third single-wheeled roller with a smooth roll surface or a third planar conveyor with a smooth plane, and then performing roll-bonding, such that the flip chip LEDs in the flip chip LED array are bonded to and embedded in the recesses on the photoconversion sheets of the sheet-melted photoconversion sheet array, to obtain the LED package elements.

The third rolling device with a smooth surface is the third single-wheeled roller with a smooth roll surface or the third planar conveyor with a smooth plane, the fourth rolling device with a recess array is the fourth single-wheeled roller with a recess array or the fourth planar conveyor with a recess array, and at least one of the device arranged with the photoconversion sheet array and the device arranged with the flip chip LED array sheet is a single-wheeled roller.

Figure 6:
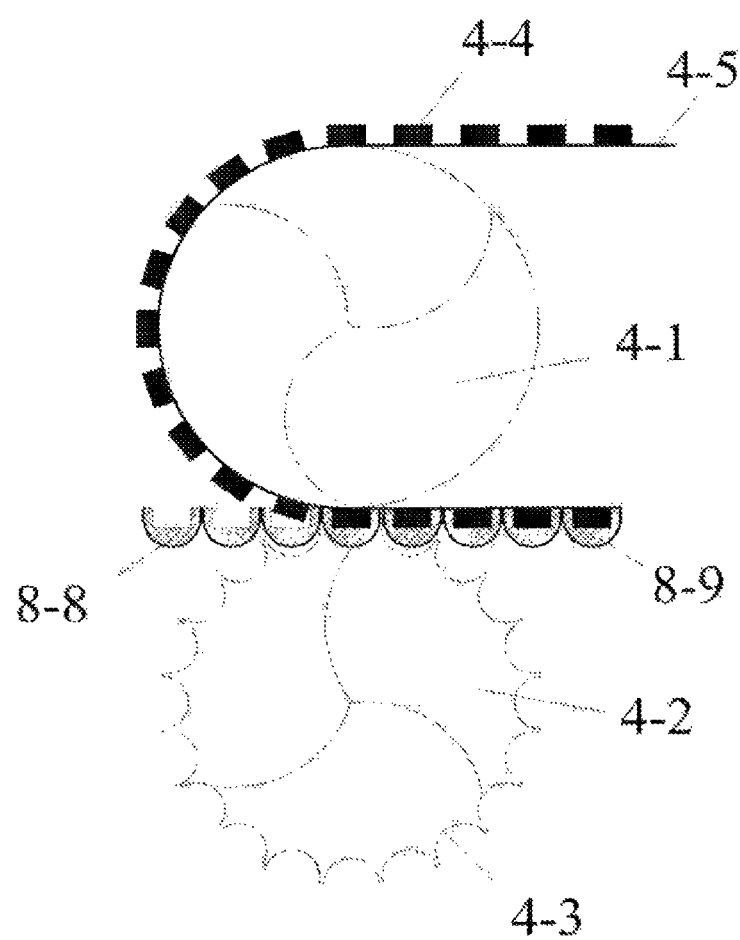
FIG. 6 is a schematic process diagram of an embodiment of forming LED package elements by roll-bonding in the process for bond-packaging an LED using a special-shaped organic silicone resin photoconverter according to the present invention.

Referring to FIG. 6, FIG. 6 shows step 5 of performing roll-bonding on the photoconversion sheet array formed by individual photoconversion sheets (8-8) after sheet melting and the flip chip LED array sheet by using the third single-wheeled roller (4-1) with a smooth surface and the fourth single-wheeled roller (4-2) with a recess array, the photoconversion sheet array and the flip chip LED array sheet facing each other and being aligned with each other, to obtain LED package elements (8-9).

The temperature of the forming of LED package elements by roll-bonding in step 5 ranges from 50° C. to 120° C. An optimal temperature of the roll-bonding in step 5 ranges from 80° C. to 100° C.

The photocuring in step 6 is curing with an active energy ray; and the curing temperature of the heat curing ranges from 140° C. to 180° C., and curing duration is greater than or equal to 1 h. An optimal curing temperature ranges from 150° C. to 160° C., and optimal curing duration is 2 h.

The width of the slit in step 7 is within 20 μm. An optimal width of the slit is 15 μm.

Step 7 of cutting of the cured LED package elements refers to: performing roll-cutting on the cured LED package elements by using a fifth rolling device with an array cutter and a sixth rolling device with a smooth surface in a face-to-face alignment manner, to obtain finished LED package elements having slits for splitting the finished product into individual LED package elements.

The fifth rolling device with an array cutter is a fifth single-wheeled roller with an array cutter or a fifth planar conveyor with an array cutter, the sixth rolling device with a smooth surface is a sixth single-wheeled roller with a smooth surface or a sixth planar conveyor with a smooth surface, and at least one of the fifth rolling device with an array cutter and the sixth rolling device with a smooth surface is a single-wheeled roller, the array cutter being a cutter having an array of rectangular grids. Dimensions of the rectangular grid are the same as those of finished individual LED package elements.

Figure 7A:
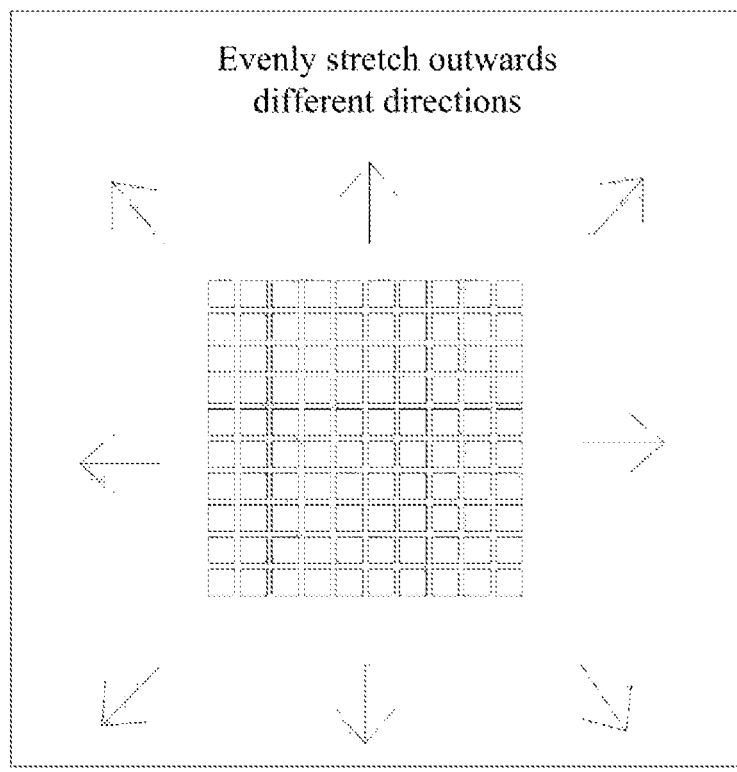
FIG. 7A is a schematic planar structural diagram of finished LED package elements manufactured according to the present invention.
Figure 7B:
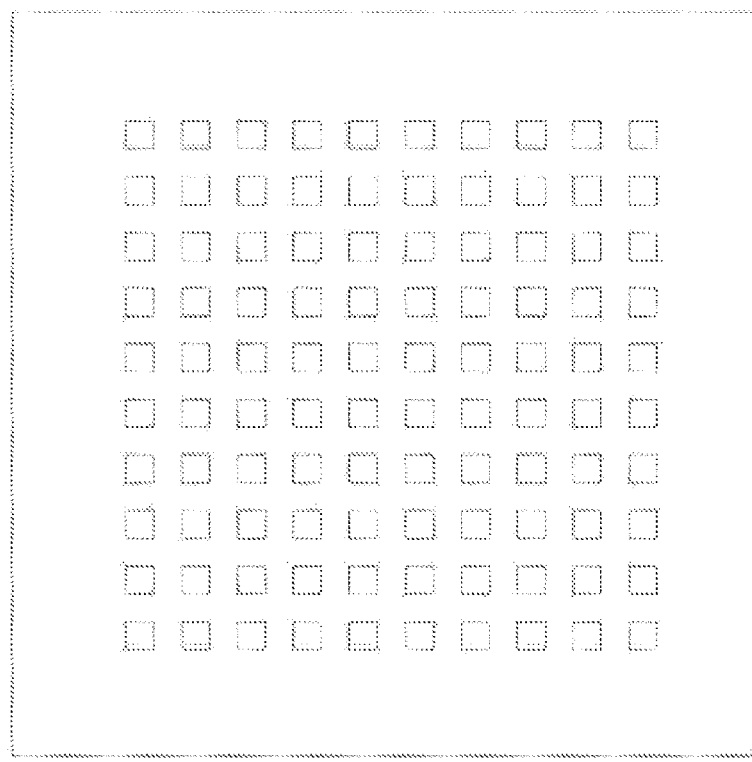
FIG. 7B is a schematic planar structural diagram of finished individual LED package elements obtained by extending according to the present invention.

As required, a stretcher may be used to stretch the stretchable carrier film of the finished LED package elements of the present invention, such that the finished LED package elements are split along the slits after being stretched, to obtain finished individual LED package elements, as shown in FIG. 7A and FIG. 7B.

Figure 8A:
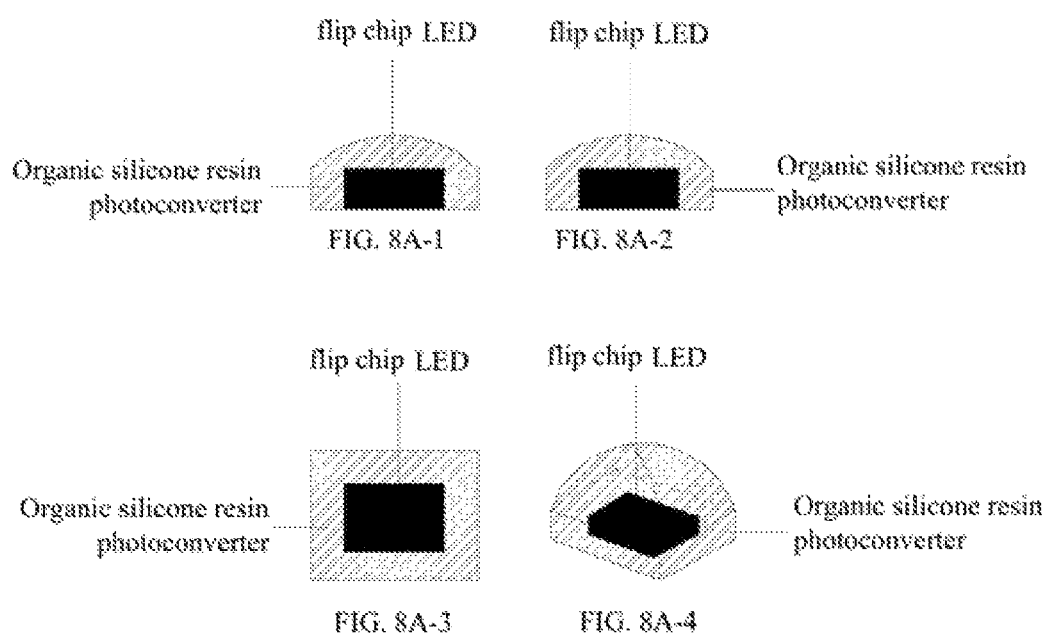
FIG. 8A shows a cambered-surface LED package element manufactured according to the present invention, where
Figure 8B:
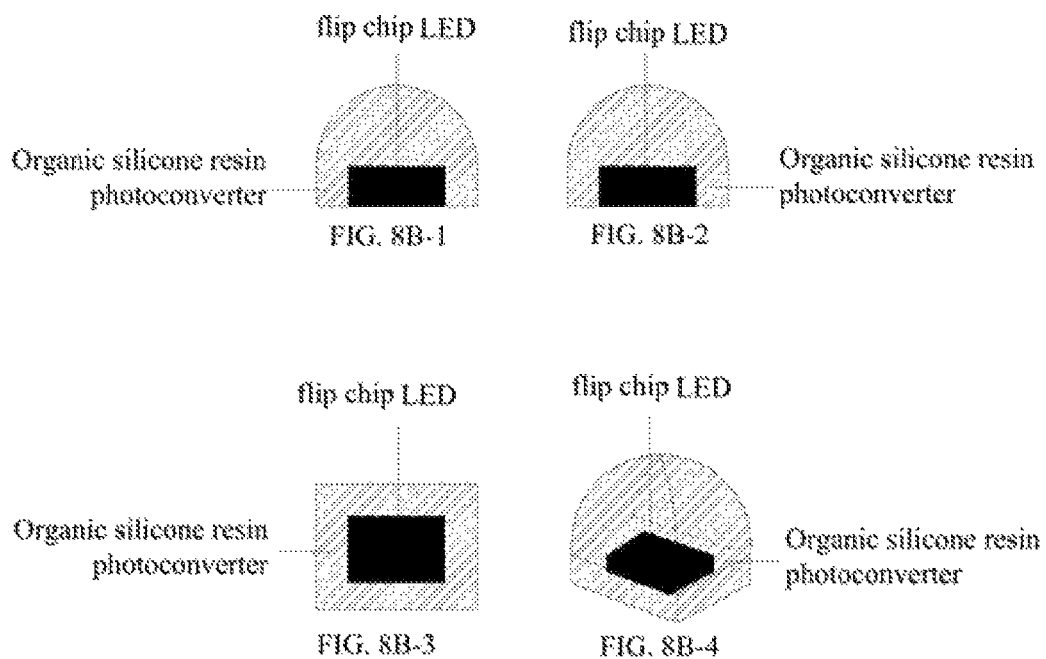
FIG. 8B shows a hemispheric-surface LED package element manufactured according to the present invention, where
Figure 8C:
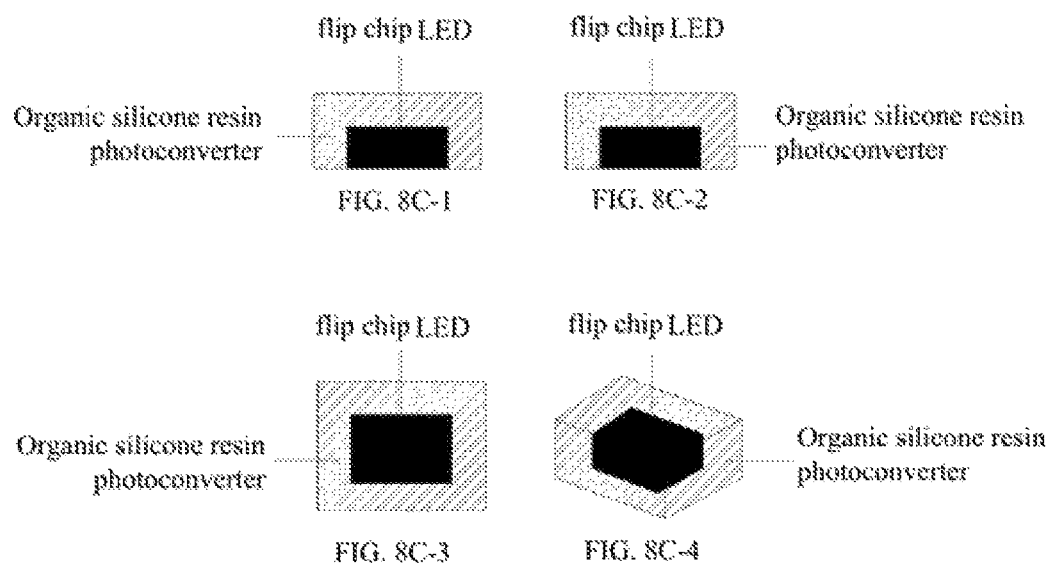
FIG. 8C shows a planar-surface LED package element manufactured according to the present invention, where

Each finished individual LED package element manufactured according to the present invention may be an arc-shaped LED package element, a hemispheric LED package element, or a rectangular LED package element, as shown in FIGS. 8A, 8B and 8C.

The process for bond-packaging an LED using a special-shaped organic silicone resin photoconverter provided by the present invention is widely applicable to a packaging process of bonding an organic silicone resin photoconverter to LEDs of different power.

Embodiment 2

The present invention provides an equipment system applied to a process for bond-packaging an LED using a special-shaped organic silicone resin photoconverter, which includes: a smooth-surface roll-laminating apparatus used for refining a photoconversion sheet; a roll-shaping apparatus used for performing heating and roll-shaping on the refined photoconversion sheet; a sheet-melting apparatus used for performing sheet melting on the roll-shaped refined photoconversion sheet; and a roll-bonding apparatus used for performing roll-bonding on the sheet-melted refined photoconversion sheet and a flip chip LED array with a carrier film, the refined photoconversion sheet and the flip chip LED array facing each other and being aligned with each other. The roll-laminating apparatus, the roll-shaping apparatus, the sheet-melting apparatus, and the roll-bonding apparatus are arranged sequentially to form cooperatively linked process equipment. The roll-laminating apparatus includes one or more sets of smooth-surface rolling components A and smooth-surface rolling components B that perform rolling face-to-face in alignment with each other. The roll-shaping apparatus includes a first rolling device with a protrusion array and a second rolling device with a recess array that perform rolling face-to-face in alignment with each other. The roll-bonding apparatus includes a third rolling device with a smooth surface and a fourth rolling device with a recess array that perform rolling face-to-face in alignment with each other.

Specific implementations of the equipment system applied to the process for bond-packaging an LED using a special-shaped organic silicone resin photoconverter provided by the present invention are further disclosed as follows:

In the smooth-surface roll-laminating apparatus, the smooth-surface rolling component A is a smooth-surface single-wheeled roller A or a smooth-surface planar conveyor A, the smooth-surface rolling component B is a smooth-surface single-wheeled roller B or a smooth-surface planar conveyor B, and at least one of the smooth-surface rolling component A and the smooth-surface rolling component B is a single-wheeled roller. Referring to FIGS. 3A, 3B and 3C, FIG. 3A shows that the smooth-surface rolling device includes a smooth-surface single-wheeled roller A1 (1-1) and a smooth-surface single-wheeled roller B1 (1-2) that perform rolling face-to-face in alignment with each other; FIG. 3B shows that the roll-laminating apparatus includes a smooth-surface single-wheeled roller A1 (1-1) and a smooth-surface single-wheeled roller B1 (1-2) that perform rolling face-to-face in alignment with each other; and FIG. 3C shows that the roll-laminating apparatus includes two sets of smooth-surface rolling components A and smooth-surface rolling components B, specifically including a smooth-surface single-wheeled roller A1 (1-1) and a smooth-surface single-wheeled roller B1 (1-2) that perform rolling face-to-face in alignment with each other, and a smooth-surface single-wheeled roller A2 (1-3) and a smooth-surface single-wheeled roller B2 (1-4) that perform rolling face-to-face in alignment with each other. The one or more sets of smooth-surface roll-laminating apparatuses are used to roll a first outer protective film (8-3), a semi-cured photoconversion membrane (8-1) or semi-cured photoconversion slurry (8-2), and a second outer protective film (8-4), to obtain a refined photoconversion sheet (8-6).

In the roll-shaping apparatus, the first rolling device with a protrusion array is a first single-wheeled roller with a protrusion array or a first planar conveyor with a protrusion array; the second rolling device with a recess array is a second single-wheeled roller with a recess array or a second planar conveyor with a recess array; and at least one of the first rolling device and the second rolling device is a single-wheeled roller. Referring to FIG. 4A and FIG. 4B, FIG. 4A shows that the roll-shaping apparatus includes a first single-wheeled roller (2-1) with a protrusion array and a second single-wheeled roller (2-2) with a recess array that are disposed face to face and aligned with each other; and FIG. 4B shows that the roll-shaping apparatus includes a first single-wheeled roller (2-1) with a protrusion array and a second planar conveyor (2-3) with a recess array that are disposed face to face and aligned with each other. The roll-shaping apparatus is used to perform heating and roll-shaping on the refined photoconversion sheet (8-6) with the first outer protective film (8-3) and the second outer protective film (8-4), to obtain a photoconversion sheet array formed by individual photoconversion sheets (8-7) with recesses.

The sheet-melting apparatus is a light irradiation apparatus. Referring to FIG. 5, FIG. 5 shows that, before sheet melting, the photoconversion sheet array formed by individual photoconversion sheets (8-7) with recesses passes through the sheet-melting apparatus 3, and the second outer protective film (8-4) of the photoconversion sheet array is radiated by light and then is integrated with the semi-cured photoconversion sheet, to obtain a sheet-melted photoconversion sheet array formed by individual photoconversion sheets (8-8) with recesses.

In the roll-bonding apparatus, the third rolling device with a smooth surface is a third single-wheeled roller with a smooth roll surface or a third planar conveyor with a smooth plane, the fourth rolling device with a recess array is a fourth single-wheeled roller with a recess array or a fourth planar conveyor with a recess array, and at least one of the device arranged with the photoconversion sheet array and the device arranged with a flip chip LED array sheet is a single-wheeled roller. Referring to FIG. 6, FIG. 6 shows that the roll-bonding apparatus includes a third single-wheeled roller (4-1) with a smooth surface and a fourth single-wheeled roller (4-2) with a recess array that perform rolling face-to-face in alignment with each other. The third single-wheeled roller (4-1) with a smooth surface and the fourth single-wheeled roller (4-2) with a recess array are used to perform roll-bonding on the sheet-melted photoconversion sheet array formed by individual photoconversion sheets (8-8) and the flip chip LED array sheet, the photoconversion sheet array and the flip chip LED array sheet facing each other and being aligned with each other, to obtain LED package elements (8-9).

The roll-laminating apparatus is provided with a displacement adjusting device for adjusting a distance between the smooth-surface rolling component A and the smooth-surface rolling component B. The roll-shaping apparatus is provided with a displacement adjusting device for adjusting a distance between the first rolling device and the second rolling device. The roll-bonding apparatus is provided with a displacement adjusting device for adjusting a distance between the third rolling device and the fourth rolling device.

Either of the smooth-surface rolling component A and the smooth-surface rolling component B in the roll-laminating apparatus is a single-wheeled roller, and a radial run-out distance of the roller is less than or equal to 2 µm. Either of the first rolling device with a protrusion array and the second rolling device with a recess array in the roll-shaping apparatus is a single-wheeled roller, and a radial run-out distance of the roller is less than or equal to 2 µm. Either of the third rolling device with a smooth surface and the fourth rolling device with a recess array in the roll-bonding apparatus is a single-wheeled roller, and a radial run-out distance of the roller is less than or equal to 2 µm.

In the second rolling device with a recess array in the roll-shaping apparatus and the fourth rolling device with a recess array in the roll-bonding apparatus, the recess arrays have the same recess shape, where the recess shape is a cambered surface, a hemispheric surface or a planar surface.

In the first rolling device with a protrusion array in the roll-shaping apparatus, the shape of a protrusion in the protrusion array is a rectangle, and the length, width, and height of the protrusion are 1.01 to 1.05 times of those of a flip chip LED.

The equipment system further includes a curing apparatus for curing LED package elements, where the curing apparatus is process equipment located at a rear end of the roll-bonding apparatus.

The curing apparatus is a tunnel-type temperature control apparatus or a tunnel-type illuminating apparatus. The tunnel-type temperature control apparatus includes a heating component, a temperature control component and a conveyor belt passage. The tunnel-type illuminating apparatus includes an illuminating component, an illumination intensity control component and a conveyor belt passage.

The equipment system further includes a cutting apparatus for cutting cured LED package elements, where the cutting apparatus is process equipment disposed at a rear end of the curing apparatus.

The cutting apparatus is a roll-cutting apparatus, where the roll-cutting apparatus includes a rolling component C with an array cutter and a rolling component D with a smooth surface that are disposed face-to-face and aligned with each other.

The rolling component C with an array cutter in the roll-cutting apparatus is a single-wheeled roller C with an array cutter or a planar conveyor C with an array cutter. The rolling component D with a smooth surface is a single-wheeled roller D with a smooth surface or a planar conveyor D with a smooth surface. At least one of the rolling component C with an array cutter and the rolling component D with a smooth surface is a single-wheeled roller. The array cutter is a cutter having an array of rectangular grids. Dimensions of the rectangular grid are the same as those of finished individual LED package elements.

The roll-cutting apparatus is provided with a displacement adjusting device for adjusting a distance between the rolling component C with an array cutter and the rolling component D with a smooth surface. Either of the rolling component C with an array cutter and the rolling component D with a smooth surface is a single-wheeled roller, and a radial run-out distance of the roller is less than or equal to 2 µm.

The equipment system further includes a flip chip LED array forming apparatus for forming a flip chip LED array. The LED flip chip array forming apparatus is process equipment disposed at a front end of the roll-bonding apparatus. The LED flip chip array forming apparatus includes a manipulator for grabbing and placing a flip chip LED, and a planar conveying component having an accurate displacement positioning function.

The roll-laminating apparatus, the roll-shaping apparatus, the sheet-melting apparatus, the chip array forming apparatus, the roll-bonding apparatus, the curing apparatus, and the cutting apparatus in the equipment system are sequentially and cooperatively linked, to form flow-type continuous process equipment.

Any description not involved in the specific implementations of the present invention belongs to well-known technologies in the art and can be implemented with reference to the well-known technologies.

The present invention gains a satisfactory trial result after repeated test and verification.

The foregoing specific implementations and embodiments give a specific support for a technical idea of a process for bond-packaging an LED using a special-shaped organic silicone resin photoconverter according to the present invention, and are not intended to limit the protection scope of the present invention. Any equivalent changes or modifications made on the basis of the technical solutions according to the technical idea proposed in the present invention still fall within the protection scope of the technical solutions of the present invention.

What is claimed is:

1. A process method for bond-packaging an LED using an organic silicone resin photoconverter, comprising the following continuous process flow: roll-molding of a refined photoconversion sheet, roll-shaping of a photoconversion sheet array, sheet melting for the photoconversion sheet array, preparation of a flip chip LED array sheet, forming of LED package elements by roll-bonding, curing of the LED package elements, and cutting of the LED package elements, comprising the following basic steps:
    step 1: roll-molding of a refined photoconversion sheet: in a vacuum heating condition, rolling a first outer protective film, a semi-cured photoconversion material, and a second outer protective film by using one or more sets of smooth-surface roll-laminating apparatuses, to obtain a refined photoconversion sheet formed by a first outer protective film, a semi-cured photoconversion sheet, and a second outer protective film, the semi-cured photoconversion material being a semi-cured photoconversion membrane or semi-cured photoconversion slurry, and the material of the second outer protective film being meltable organic silicon photosensitive resin containing at least a photoconversion material;
    step 2: roll-shaping of a photoconversion sheet array: in a vacuum condition, performing heating and roll-shaping on the refined photoconversion sheet with the outer protective films by using a first rolling device with a protrusion array and a second rolling device with a recess array that are disposed face-to-face and aligned with each other, to obtain a photoconversion sheet array formed by individual photoconversion sheets with recesses, the recesses being located at a side close to the second outer protective film, and the shape of the individual photoconversion sheet with recesses;
    step 3: sheet melting for the photoconversion sheet array: in a vacuum illumination condition, melting the second outer protective film of the photoconversion sheet array in step 2, to obtain a sheet-melted photoconversion sheet array;
    step 4: preparation of a flip chip LED array sheet: acquiring a flip chip LED array sheet, wherein flip chip LEDs in the flip chip LED array sheet are arranged in an array on a carrier film, the flip chip LED referring to an individual LED flip chip or a flip chip LED assembly;
    step 5: forming of LED package elements by roll-bonding: in a vacuum heating condition, performing roll-bonding on the sheet-melted photoconversion sheet array in step 3 and the flip chip LED array sheet in step 4 by using a third rolling device with a smooth surface and a fourth rolling device with a recess array, the photoconversion sheet array and the flip chip LED array sheet facing each other and being aligned with each other, such that the flip chip LEDs in the flip chip LED array sheet are bonded to and embedded in the recesses on the individual photoconversion sheets of the sheet-melted photoconversion sheet array, to obtain LED package elements, a recess shape and recess dimensions of the recess array of the fourth rolling device being the same as those of the recess array of the second rolling device;
    step 6: curing of the LED package elements: by means of heat curing and/or photocuring, curing the LED package elements in step 5 by using a curing apparatus, to obtain cured LED package elements; and
    step 7: cutting of the LED package elements: removing the first outer protective film from the cured LED package elements in step 6, and cutting the cured LED package elements, to form finished LED package elements having slits for splitting the finished product into individual LED package elements.

2. The process method for bond-packaging an LED using an organic silicone resin photoconverter according to claim 1, wherein in step 1 of roll-molding of a refined photoconversion sheet refers to rolling a first outer protective film, a semi-cured photoconversion material, and a second outer protective film by using one or more sets of smooth-surface roll-laminating apparatuses, wherein rolling is performed sequentially by using one or more sets of smooth-surface double-roller roll-laminating apparatuses that are disposed face-to-face and aligned with each other and/or a rolling apparatus formed by a smooth-surface single-wheeled roller and a smooth-surface planar conveyor, to obtain the refined photoconversion sheet.

3. The process method for bond-packaging an LED using an organic silicone resin photoconverter according to claim 2, wherein the temperature of the roll-molding of a refined photoconversion sheet in step 1 ranges from 50° C. to 120° C.

4. The process method for bond-packaging an LED using an organic silicone resin photoconverter according to claim 3, wherein the thickness of the refined photoconversion sheet in step 1 is within 800 μm.

5. The process method for bond-packaging an LED using an organic silicone resin photoconverter according to claim 1, wherein the material of the semi-cured photoconversion sheet in step 1 is a semi-cured organic silicone resin fluorescent powder membrane or a semi-cured organic silicone resin quantum dot fluorophor membrane.

6. The process method for bond-packaging an LED using an organic silicone resin photoconverter according to claim 5, wherein the material of the first outer protective film in step 1 is polyester, polyolefin, or polyether.

7. The process method for bond-packaging an LED using an organic silicone resin photoconverter according to claim 5, wherein the photoconversion material in the second outer protective film in step 1 and the photoconversion material in the semi-cured photoconversion sheet are identical materials with identical contents.

8. The process method for bond-packaging an LED using an organic silicone resin photoconverter according to claim 7, wherein the material of the second outer protective film comprises an adhesive.

9. The process method for bond-packaging an LED using an organic silicone resin photoconverter according to claim 1, wherein in step 2, the first rolling device with a protrusion array is a first single-wheeled roller with a protrusion array or a first planar conveyor with a protrusion array; the second rolling device with a recess array is a second single-wheeled roller with a recess array or a second planar conveyor with a recess array; and at least one of the first rolling device and the second rolling device is a single-wheeled roller.

10. The process method for bond-packaging an LED using an organic silicone resin photoconverter according to claim 9, wherein the shape of the individual photoconversion sheet with recesses in step 2 refers to: the shape of each individual photoconversion sheet with recesses being a cambered surface, a hemispheric surface, or a planar surface.

11. The process method for bond-packaging an LED using an organic silicone resin photoconverter according to claim 10, wherein for each individual photoconversion sheet with recesses in step 2, the length, width, and height of a recess are 1.01 to 1.05 times of those of a flip chip LED.

12. The process method for bond-packaging an LED using an organic silicone resin photoconverter according to claim 10, wherein the temperature of the roll-shaping of a photoconversion sheet array in step 2 ranges from 50° C. to 120° C.

13. The process method for bond-packaging an LED using an light emitting surface layer organic silicone resin photoconverter according to claim 1, wherein the sheet melting in step 3 refers to: melting the second outer protective film by means of light irradiation and integrating the melted sheet with the semi-cured photoconversion sheet in step 1.

14. The process method for bond-packaging an LED using an organic silicone resin photoconverter according to claim 1, wherein
step 5 of performing roll-bonding on the sheet-melted photoconversion sheet array in step 3 and the flip chip LED array sheet in step 4 by using a third rolling device with a smooth surface and a fourth rolling device with a recess array, the photoconversion sheet array and the flip chip LED array sheet facing each other and being aligned with each other refers to: arranging the photoconversion sheet array on a fourth single-wheeled roller with a recess array or a fourth planar conveyor with a recess array, arranging the flip chip LED array sheet on a third single-wheeled roller with a smooth roll surface or a third planar conveyor with a smooth plane, and then performing roll-bonding, such that the flip chip LEDs in the flip chip LED array are bonded to and embedded in the recesses on the photoconversion sheets of the sheet-melted photoconversion sheet array, to obtain the LED package elements, wherein
the third rolling device with a smooth surface is the third single-wheeled roller with a smooth roll surface or the third planar conveyor with a smooth plane, the fourth rolling device with a recess array is the fourth single-wheeled roller with a recess array or the fourth planar conveyor with a recess array, and at least one of the device arranged with the photoconversion sheet array and the device arranged with the flip chip LED array sheet is a single-wheeled roller.

15. The process method for bond-packaging an LED using an organic silicone resin photoconverter according to claim 14, wherein the temperature of the forming of LED package elements by roll-bonding in step 5 ranges from 50° C. to 120° C.

16. The process method for bond-packaging an LED using an organic silicone resin photoconverter according to claim 1, wherein the photocuring manner in step 6 is curing with an active energy ray; and the curing temperature in the heat curing ranges from 140° C. to 180° C., and curing duration is greater than or equal to 1 h.

17. The process method for bond-packaging an LED using an organic silicone resin photoconverter according to claim 1, wherein the width of the slit in step 7 is within 20 µm.

18. The process method for bond-packaging an LED using an organic silicone resin photoconverter according to claim 1, wherein step 7 of cutting of the cured LED package elements refers to: performing roll-cutting on the cured LED package elements by using a fifth rolling device with an array cutter and a sixth rolling device with a smooth surface in a face-to-face alignment manner, to obtain finished LED package elements having slits for splitting the finished product into individual LED package elements, wherein
the fifth rolling device with an array cutter is a fifth single-wheeled roller with an array cutter or a fifth planar conveyor with an array cutter, the sixth rolling device with a smooth surface is a sixth single-wheeled roller with a smooth surface or a sixth planar conveyor with a smooth surface, and at least one of the fifth rolling device with an array cutter and the sixth rolling device with a smooth surface is a single-wheeled roller, the array cutter being a cutter having an array of rectangular grids.

19. The process method for bond-packaging an LED using an organic silicone resin photoconverter according to claim 1, wherein the carrier film in the flip chip LED array sheet in step 4 is a stretchable carrier film, and a material of the stretchable carrier film is one of heat-resistant polyester, polydimethylsiloxane, and polyvinyl chloride.

20. The process method for bond-packaging an LED using an organic silicone resin photoconverter according to claim 19, wherein a stretcher is used to stretch the stretchable carrier film of the finished LED package elements in step 7, such that the finished LED package elements are split along the slits after being stretched, to obtain finished individual LED package elements.

* * * * *